United States Patent [19]

Daniele

[11] Patent Number: 4,733,253

[45] Date of Patent: Mar. 22, 1988

[54] APPARATUS AND METHOD FOR DETECTING AND ELIMINATING DIODE LASER MODE HOPPING

[75] Inventor: Joseph J. Daniele, Pittsford, N.Y.

[73] Assignee: Xerox Corporation, Stamford, Conn.

[21] Appl. No.: 882,123

[22] Filed: Jul. 3, 1986

[51] Int. Cl.[4] ............................ G01D 9/42; H01S 3/13
[52] U.S. Cl. .................................. 346/108; 346/1.1; 372/29; 372/33; 372/24; 372/32
[58] Field of Search ................ 346/108, 107 R, 76 L, 346/1.1, 160; 358/296; 372/29, 33, 34, 24, 32, 19

[56] References Cited

U.S. PATENT DOCUMENTS

| | | | |
|---|---|---|---|
| 3,588,254 | 6/1971 | Rhoades | 356/106 |
| 3,588,738 | 6/1971 | Goodwin | 331/94.5 |
| 3,790,901 | 2/1974 | White et al. | 331/94.5 |
| 3,902,135 | 8/1975 | Terada et al. | 331/94.5 S |
| 4,103,254 | 7/1978 | Chikami | 331/94.5 S |
| 4,309,671 | 1/1982 | Malyon | 331/94.5 S |
| 4,428,643 | 1/1984 | Kay | 350/3.71 |

OTHER PUBLICATIONS

Wang et al.; "Measurement & Control of Subangstrom Mirror Displacement by Acousto-Optical Technique"; Rev. Sci. Instrum; 53(7); Jul. 1982; pp. 963–966.

Wittke et al.; "Stabilization of CW Injection Lasers"; 4/9/75; RCA Technical Notes; TN No. 1005; pp. 1–3.

Primary Examiner—E. A. Goldberg
Assistant Examiner—Mark Reinhart
Attorney, Agent, or Firm—Frederick E. McMullen

[57] ABSTRACT

A printer having holographic scanning disc for scanning the imaging beam from a laser diode across a recording member, with a detector for detecting a shift in wavelength of the diode utilizing the zero order beam passing through the holographic scanning disc and a temperature control for controlling diode temperatures, the detector actuating the temperature control to adjust the temperature of the diode when a shift in the wavelength of the zero order beam from a non-mode hop wavelength to another wavelength is detected, adjustment of the diode temperature shifting the beam wavelength back toward the non-mode hop wavelength region.

12 Claims, 5 Drawing Figures

APPARATUS AND METHOD FOR DETECTING AND ELIMINATING DIODE LASER MODE HOPPING

The invention relates to raster output scanners with laser diode and holographic scanning disc, and more particularly, to a control for sensing and controlling laser diode mode hopping.

As the technology of raster output scanners, often referred to as ROS's, evolves, one major improvement of interest involves replacement of the scanning polygon and the relatively complex cylindrical correction optics normally associated therewith with a holographic scanning system. In that type of scanning system, a holographic disc having a succession of grating facets about the periphery thereof is used in place of a polygon to raster scan the imaging beam across a recording member. A further improvement commensurate with this would replace the relatively bulky gas laser and its attendant modulator with a relatively small internally modulated laser diode.

However, combining a laser diode with a holographic scanning system presents at least one major problem, i.e. the tendency of laser diodes to mode hop due to the diode's inherent frequency instability. This tendency of laser diodes is rooted in the very broad gain curve of a laser diode and their tendency to shift frequencies with changes in temperature. As a result, laser diodes, even those laser diodes normally operating as single longitudinal mode lasers shift from one longitudinal mode to another as temperature or equivalently duty cycle or power level change.

In the prior art, tuning lasers to provide a stabilized laser frequency are known as evidenced by U.S. Pat. No. 4,103,254 (Chikami) wherein detectors are used to sense laser beam energy sharing, by U.S. Pat. No. 3,588,738 (Goodwin) wherein the laser output beam is split to permit amplitude comparison for use in controlling a frequency adjusting element, and by U.S. Pat. No. 3,588,254 (Rhoades) wherein a calibration system for adjusting laser frequency is provided using a laser heater. Additionally, U.S. Pat. No. 3,790,901 to White et al discloses a system for electro-optically producing a dual polarization laser, while U.S. Pat. No. 3,902,135 to Terada et al describes a laser with an adjustable mirror facet to control and stabilize laser wavelength irrespective of temperature changes.

Further, U.S. Pat. No. 4,309,671 (Malyon) discloses a feedback control which responds to the emission wavelength of a laser diode. In that arrangement, beam splitters impinge a portion of the laser beam onto a pair of photodiodes, the beam to one photodiode being filtered through a frequency dependent filter. The output signals from the photodiode pair are amplified and subtracted from one another to provide a feed back signal which after amplification controls a laser operating parameter such as temperature to maintain constant wavelength. Other prior art interest in this subject is found in the article "Measurement and Control of Subangstrom Mirror Displacement by Acousto-Optical Technique" by C. P. Wang, R. L. Varwig, and P. J. Ackman (Rev. Sci. Instrum, 53(7), July 1982, pp 963–966) in which the importance of controlling laser frequency and mode stability through laser mirror spacing and angular orientation are discussed, and the RCA publication "Stablization of Cw Injection Lasers" by J. P. Wittke, D. R. Patterson, and I. Ladany (RCA Technical Notes, No. 1005, Apr. 9, 1975), where both the effect of laser temperature and aging on laser threshold current is discussed. In the RCA article, it is concluded that both laser drive current and operating temperature must be controlled to achieve constant laser output power and that this may be effected by using a feedback system in which an optical detector is used to sense laser beam intensity, with the signal output of the detector then compared with a reference signal to provide control signals for a thermoelectric cooler.

In contrast, the present invention provides a printer having a recording member on which images to be printed are formed through exposure, the recording member being movable in a first scanning direction; a laser for generating a beam of high intensity light for exposing the recording member in accordance with an image signal; a rotatable holographic disc having a succession of beam diffraction gratings, the disc being disposed relative to the laser so that the beam emitted by the laser is in the path of rotation of the disc whereby the beam impinges on the disc facets in succession as the disc rotates to provide an exposure beam for scanning the recording member in a second scanning direction; wavelength compensating means for compensating for temperature induced mode hop of the beam in the first scanning direction, the compensating means being between the laser and the disc and providing in cooperation with the disc diffraction gratings a non-exposure beam; a beam position detector; the beam position detector outputting a signal representative of the current point where the non-imaging beam impinges on the beam position detector; comparator means for comparing the signal output of the beam position detector with a reference signal representing a preselected point within a non-mode hop region of the laser beam and outputting a control signal when the current and preselected points of beam impingement on the beam position detector differ; means for focusing the non-exposure beam on the position detector; means for controlling temperatures of the laser; and control means for operating the temperature controlling means in response to the control signal to adjust the temperature of the laser so that the non-imaging beam impinges at substantially the preselected point on the beam position detector or whereby mode hop of the laser beam is avoided.

IN THE DRAWINGS

Figure 1:
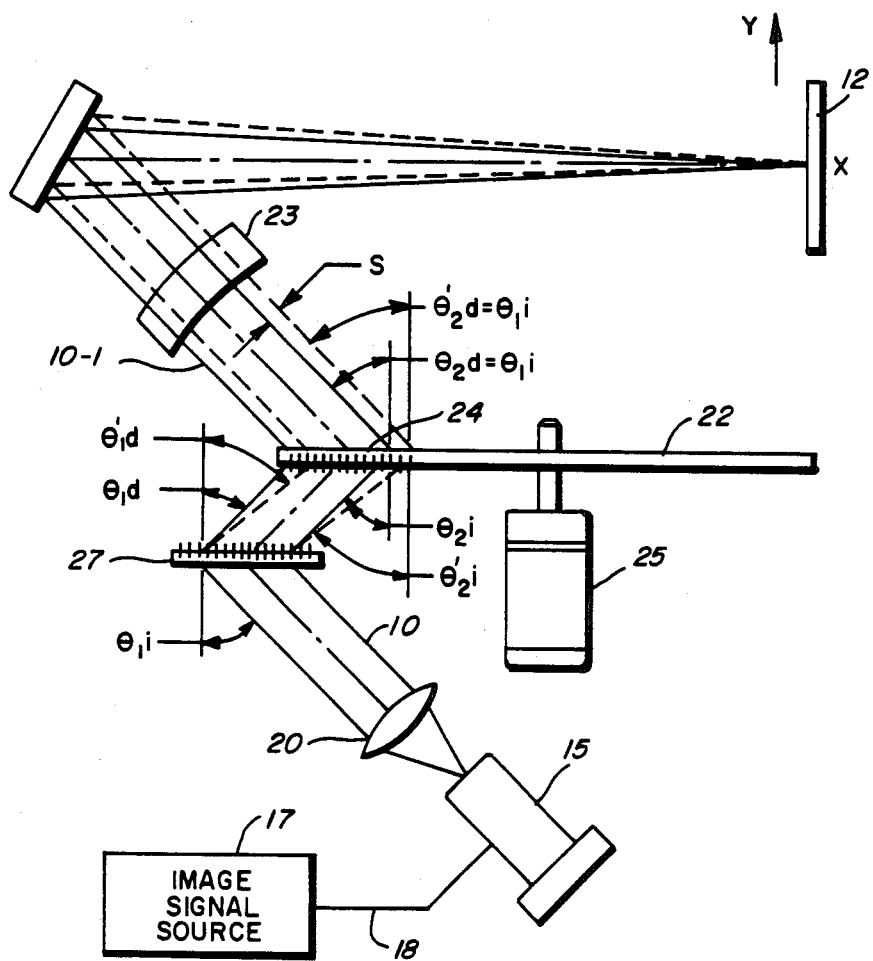
FIG. 1 is a schematic view of a prior art raster output scanner incorporating a plane linear compensating grating to nullify laser diode mode hopping in the cross scan direction only.

Referring to FIG. 1 of the drawings, there is shown a Raster Output Scanner or ROS in which a high intensity laser beam 10, modulated in accordance with an image signal input, is scanned across a recording member 12 to selectively expose member 12. The image produced on the recording member 12 is thereafter developed to provide a visible image.

Recording member 12 may comprise any suitable recording medium such as the photoreceptor of a xerographic type imaging system. In systems of that type, the photoreceptor is first uniformly charged and then exposed by beam 10 to form a latent electrostatic image thereon as represented by the image signal input. The latent electrostatic image is thereafter developed and the developed image transferred to a suitable copy substrate material such as paper. Following transfer, the image is fixed as by fusing to form a permanent image. As will be understood, recording member 12 may be in any suitable form such as drum, web, belt, etc.

Beam 10 is generated by a suitable laser diode 15 which may for example comprise a Hitachi Model No. 7801E diode. An internal modulating circuit enables the beam output by diode 15 to be modulated by the image signal input. The image signals, which may be obtained from any suitable source 17 which may comprise a memory, an input scanner, communication channel, character generator, etc., are input through line 18.

The modulated beam 10 output by diode 15 passes through a suitable collimating lens 20 and a plane linear compensating grating 27 and impinges at an angle of substantially 45° on the grating facets 24 of a rotating holographic disc 22. Disc 22 has a succession of facets 24 around the periphery thereof such that on rotation of disc 22 by motor 25, a first order beam 10-1 is scanned by each facet 24 across recording member 12 in the X direction. Concurrently, recording member 12 is moved by a suitable drive means (not shown) in the Y direction (the direction shown by the solid line arrow in FIG. 1). A suitable lens 23 is provided downstream of disc 22 for focusing beam 10 to a point on recording member 12.

As described in U.S. Pat. No. 4,428,643 to Kay, grating 27 is a wavelength compensating device which has properties identical to the face gratings formed on the surface of disc 22. In other words, if the disc facets 24 are holographically formed, grating 27 is holographically formed using the same photorecording system. Accordingly, grating 27 has the same period as the disc grating facets and consequently has the same high diffraction efficiency as disc 22. Grating 27 is placed in the tangential plane parallel to the plane of disc 22.

Assuming diode 15 is operating at its nominal wavelength, beam 10 is directed at the incident angle $\theta 1_i$ onto grating 27 and is diffracted out at diffraction angle $\theta 1_d$ (solid line path), the angles $\theta 1_i$ and $\theta 1_d$ being measured with respect to normal of the plane of the grating. Since grating 27 and disc 22 are parallel, by symmetry beam 10 is incident on the center of facet 24 at angle $\theta 2_i = \theta 1_d$. Facet 24 diffracts the beam at a diffraction angle $\theta 2_d$ which is parallel with the incident path of beam 10 at grating 27, i.e. $\theta 2_d = \theta 1_i$.

Where a shift of the wavelength of diode 15 occurs as for example due to temperature induced mode hopping, beam 10 is still incident on grating 27 at angle $\nu 1_i$ but is diffracted along a slightly different path, represented by the dotted line, at an angle $\theta' 1_d$. (The path is chosen at an exaggerated deviation angle for illustrative purposes.) The beam is incident on facet 24 at angle $\theta' 2_i$ and is diffracted out at an angle of $\theta' 2_d$ and as shown above, $\theta' 2_d = \theta 1_i$. The beam is, however, shifted by a lateral distance S from the position of the first beam. This small lateral displacement is of no consequence since lens 23 focuses all image rays parallel entering it into the same point on the plane of recording member 12.

Accordingly, in the FIG. 1 arrangement, the scanned line will be corrected for errors in the cross scan or Y direction by grating 27. However, errors in the fast scan or X direction are only corrected at zero scan angle, i.e. when the beam is in the center angular rotation position of gratings 24 of disc 22.

Figure 2:
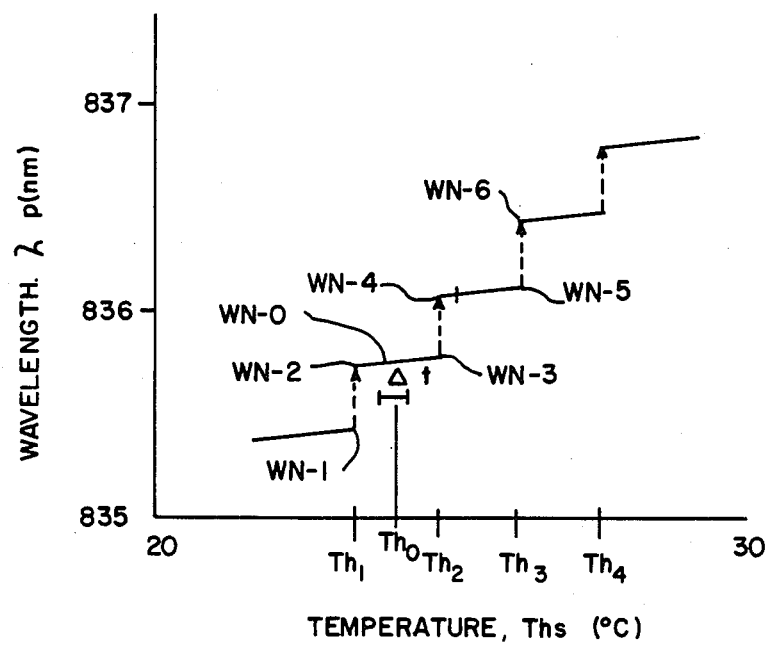
FIG. 2 is a graphical representation demonstrating the relationship between laser wavelength and temperature.

In FIG. 2 there is shown by graphical representation typical wavelength behavior of a laser diode such as diode 15 as a function of temperature. Assuming that diode 15 is initially operating in an ambient temperature condition, when the diode is modulated (assuming diode 15 is D.C. biased just below threshold) in accordance with image signal input 17, the modulation causes a temperature excursion $\Delta T$ from the ambient temperature to some higher temperature. If the temperature excursion $\Delta T$ spans a temperature $Th_1, Th_2, \ldots Th_n$ at which mode hopping takes place, then the laser will jump or mode hop to a different wavelength. For example, where the temperature excursion $\Delta T$ spans temperature $Th_2$, then a mode hop from wavelength $Wn_3$ to $Wn_4$ occurs. If the $\Delta T$ excursion however lies between two mode hopping temperatures, for example between $Th_1$ and $Th_2$, then no mode hop occurs and the beam output by laser diode 15 remains stable at a single wavelength.

Figure 3:
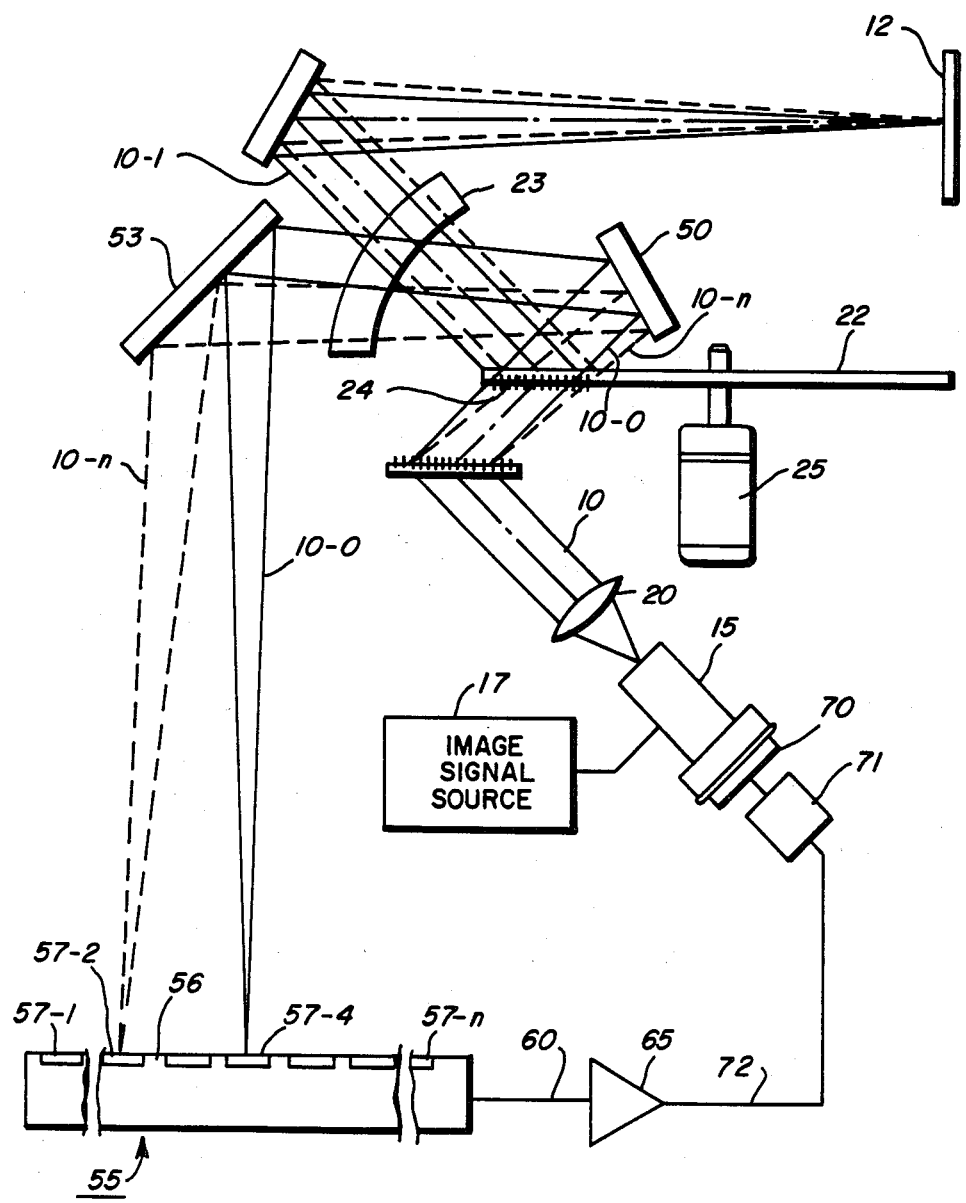
FIG. 3 is a schematic view showing the mode hopping control of the present invention for raster output scanners, with beam pickoff mirrors, beam position detector, diode temperature control element, and control circuitry for detecting and preventing diode mode hopping.

In FIG. 3, the scanner shown in FIG. 1 is modified to detect and prevent laser mode hopping in accordance with the teachings of the present invention. There a pick-off mirror 50 is provided to intercept the zero order or non-diffracted beam 10-0 passing through the facets 24 of disc 22 together with any shifted variant (identified herein as zero order beam 10-n) that results from a mode hop by diode 15. In this example, the first order beam 10-1 is used to expose recording member 15 while the zero order beam 10-0 is typically impinged against a beam stop. In this instance, mirror 50 takes the place of the beam stop.

The zero order beam 10-0 and any shifted beam 10-n that occurs pass through lens 23, which is enlarged for this purpose, and impinge on a second mirror 53. Mirror 53 reflects the zero order beam 10-0 and any shifted beam 10-n onto the surface 56 of a suitable beam position detector shown here as a linear sensor array 55 having a row or array of photosites in the form of photodiodes 57-1, ... 57-n. Other detector types such as a lateral photodiode may instead be contemplated.

Lens 23 focuses the zero order beam 10-0, representing the no mode hop condition of laser diode 15 onto the surface 56 of array 55 at a preset point. It will be understood that the point where beam 10-0 impinges on the surface 56 of array 55 is determined by the characteristics of the scanner optical system, particularly mirrors 50,52 and lens 23.

Any shifted beam 10-n that occurs as a result of mode hop by laser diode 15 is focused by lens 23 at a point on the surface 56 of sensor array 55 that is separate from the point where zero order beam 10-0 is focused. That is, in the event of a mode hop in which the excursion temperature $\Delta T$ of the laser diode spans a mode hop temperature ($Th_1$, $Th_2$, etc. in FIG. 2), the beam 10-n, which is shifted to a different wavelength (i.e. $Wn_1$ to $Wn_2$, $Wn_2$ to $Wn_3$, etc), impinges on the surface 56 of array 55 at a different point. The output of array 55 is coupled by line 60 to a comparator circuit 65, which as will appear, compares the current beam wavelength detected by array 55 with a pre-selected desired beam wavelength and outputs a control signal in response thereto to a suitable temperature control element 70.

Temperature control element 70 which may for example comprise a Peltier or thermoelectric heater/cooler placed in heat exchange relation with laser diode 15, regulates operating temperatures of diode 15. The controller 71 for temperature control element 70 is coupled to the output of a comparator circuit 65 by line 72, controller 71 responding to the signal output of comparator circuit 65 to eiter heat or cool the diode 15 to maintain the didoe low in the non-mode hop operating region.

In order to maintain diode laser 15 in a temperature region in which mode hops do not occur, comparator circuit 65 must perform several functions. First, circuit 65 must determine or map the wavelength or photodiode positions at which mode hops (as shown in FIG. 2) occur during the start-up of the machine. This involves making a machine setup cycle in which a uniform temperature excursion of for example from 10° to 20° C. from ambient is made while noting the wavelengths at which large excursions of the beam 10-0 on the photodiodes of array 55 occur. Circuit 65 then chooses the largest temperature region between mode hops and thereafter controls laser diode temperature to stay within the chosen range.

Figure 4:
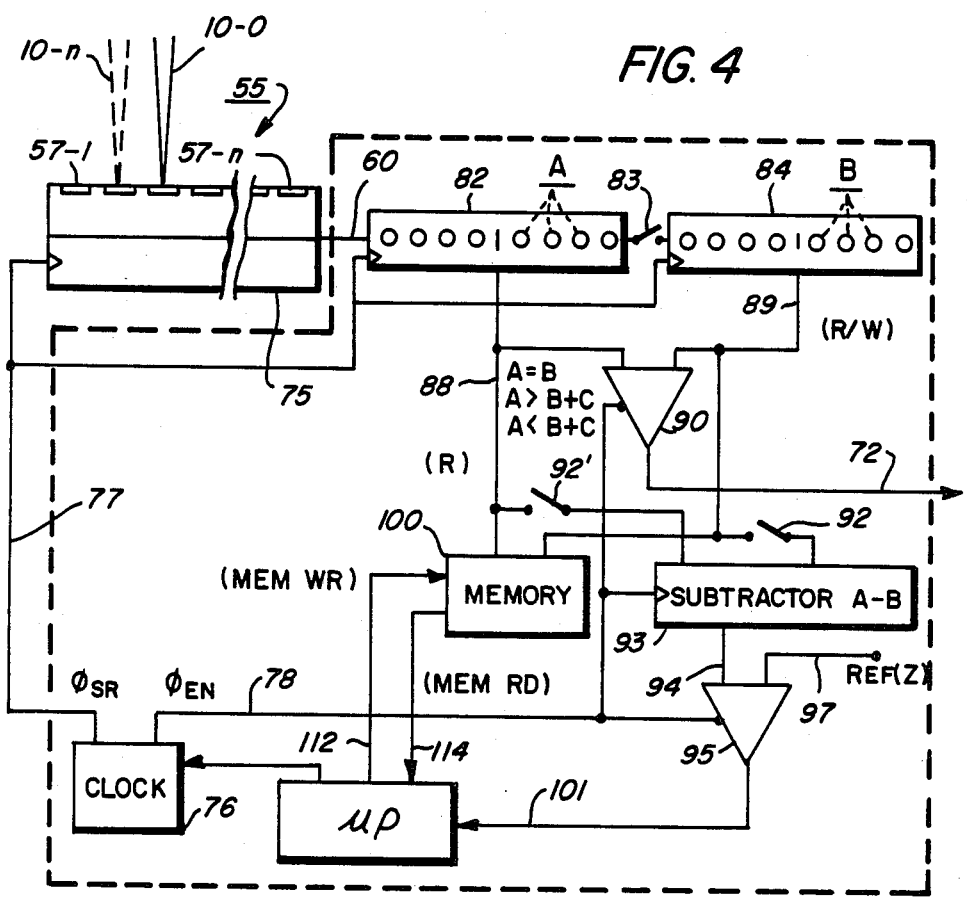
FIG. 4 is a circuit schematic of a digital circuit for comparing the operating laser beam wavelength with a reference wavelength and controlling a laser diode temperature control element in response thereto.
Figure 5:
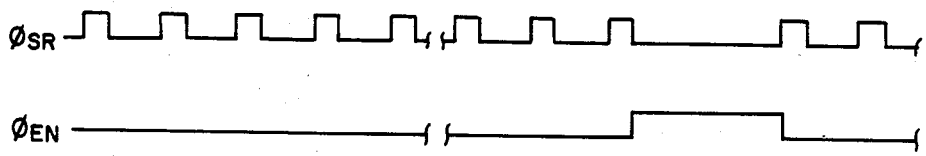
FIG. 5 is a graphical representation showing typical shift register and comparator enable clock pulse relationships.

These functions can be enabled with a relatively simple analog or digital circuit as for example the digital circuit 65 shown in FIG. 4. Referring now to FIGS. 4 and 5, photodiode array 55 has an integral digital shift register 75, the output of which is coupled by line 60 to a shift register 82. A second shift register 84 is coupled in series with shift register 82 through switch 83. Bus 88 (R) couples shift register 82 to one input of a digital comparator 90. Bus 89 (R/W) couples shift register 82 to a second input of comparator 90 and, through switch 92, to a digital subtractor 93. Switch 92' couples buss 88 to a second input of subtractor 93. The output of subtractor 93 is coupled by line 94 to one input of a second digital comparator 95 while the second input of comparator 95 is coupled by line 97 to a pre-selected digital reference number (Z). The output of comparator 95 is connected by line 101 to a suitable controller 110 which may for example comprise a microprocessor. Controller 110 controls writing and reading of numbers into and out of a suitable digital memory 100 through MEM-WR and MEM-R lines 112, 114 respectively. Bus 88(R) and bus 89 (R/W) couple the data input-output gates of memory 100 with shift register 82, 84 respectively.

A suitable clock 76 provides clock pulses through clock lead 77 for operating array 55 including the clock pulses $\Phi_{SR}$ for driving the shift registers 75, 82, and 84. Clock 76 also provides clock enable pulses $\Phi_{EN}$ to comparator 90, subtractor 93, and comparator 95 through clock lead 78, clock pulses $\Phi_{EN}$ controlling operation of comparators 90, 95 and subtractor 93. Examples of clock drive and enable pulses $\Phi_{SR}$, $\Phi_{EN}$ are shown in FIG. 5.

During the machine set up cycle, switches 83, 92 and 92' are closed and temperatures of laser diode 15 are cycled over a selected temperature range, as for example from 0° to about 20° C. above ambient. Concurrently, diode 15 is operated with a DC bias just below threshold and at a duty cycle similar to that expected in normal operation During the set up cycle, following each integration period, a number (A) representing the current position of beam 10-0 on the array of photodiodes 57 is loaded from shift register 75 of array 55 into shift register 82. On the next read out cycle of array 55, the number (A) in shift register 82 is shifted to shift register 84 (the number now being referred to as B) while a new number (A) is loaded into shift register 82.

The numbers (A, B) in shift registers 82, 84 are differenced by subtractor 90 with the difference (A−B) being right justified so that an absolute position difference is obtained. The difference (A−B) is compared by comparator 95 to the preselected digital reference number (Z). The reference number (Z), which may for example equal 16, corresponds to a large discontinuous photodiode position change associated with a mode hop. Where the difference (A−B) is greater than the reference number (Z), the signal from comparator 95 to processor 110 generates a write signal (MEM.WR.) from processor 110 to store the current numbers from shift registers 82, 84, which correspond to a mode hop wavelength $W_n$, into memory 100. Typically, the exemplary temperature excursion of 20° C. will include 5 or 6 mode hop wavelengths $W_n$.

The differences in temperature (i.e., $Th_1 - Th_2$, $Th_2 - Th_3$, $Th_3 - Th_4$, etc. in FIG. 2) between corresponding adjacent mode hop wavelengths (i.e., $W_{n1}/W_{n2}$ and $W_{n3}/W_{n4}$; $W_{n3}/W_{n4}$ and $W_{n5}/W_{n6}$, etc.) in memory 100 are compared by processor 110 and the largest difference selected (for example, between $W_{n1}/W_{n2}$ and $W_{n3}/W_{n4}$ corresponding to temperature range $Th_1 - Th_2$). A wavelength or photodiode position substantially midway between the mode hop wavelength boundaries $W_{n1}/W_{n2}$ and $W_{n3}/W_{n4}$ is chosen as the control point (identified an $W_{n0}$ and $Th_0$ in FIG. 2). The digital number representing the selected control position (i.e., $Th_0$) is loaded into shift register 84 through bus 89 (R/W) and switches 83, 92, 92' are opened, terminating the set up cycle.

During operation, digital comparator 90 is used to compare the continuously updated number (A) in shift register 82 with the reference number (B) in shift register 84 and the signal output of comparator 90 to line 72 used to control diode temperature control element 70. Where the numbers differ, the signal output of comparator 90 to temperature control element 70 actuates control element 70 to either heat or cool diode 15 to maintain temperatures of laser diode 15 so that the number (A) in shift register 82 is kept equal to the number (B) in shift register 84, $$\text{i.e., } A = B = \frac{W_{n2} + W_{n3}}{2}$$

As a result, temperature control at the selected control wavelength ($W_{n0}$) is provided.

Preferably, a small excursion range (+C) around the selected wavelength ($W_{n0}$) is allowed for very small changes in temperature due to laser modulation duty cycle changes. Thus control signals are generated only if $A > B + C$ or $A > B - C$ and the laser diode operating point is accurately maintained at the selected control wavelength ($W_{n0}$) in the center of the non-mode hop region.

It will be understood that temperature control element 70 may comprise a heating element only such as a thin film resistor designed to maintain the operating temperature of laser diode 15 at a preset elevated temperature level to prevent mode hopping. In that case, the operating wavelength of diode 15 would be at a predetermined operating temperature above the nominal ambient temperature level to which diode 5 is exposed with the heating element serving to raise the temperature level of diode to the predetermined temperature at which diode 15 outputs a beam at the wavelength desired. In the event of a rise in diode temperature levels, heating by the heating element would be terminated or curtailed, allowing the diode to cool through heat exchange with the surrounding ambient. In the event the temperature level of diode 15 falls below the predetermined operating temperature chosen, the heat element would be actuated.

In a similar manner, the temperature control element 70 may instead comprise a cooling element only, operation thereof being the converse of that described above for a heating element.

Normally, laser diode 15 is expected to have a lifetime exceeding that of the other components of the scanner. However, small changes in the mode structure probably will occur as diode 15 ages and these changes are expected to be small and rare enough to be accounted for fully by the mode hopping control and machine set up cycle of the present invention. Should a large mode structure change occur during printing that is large enough to cause a mode hop of the laser diode during modulation or when the duty cycle is such that laser temperatures are driven back and forth across the mode hop temperature, some minor copy quality degradation at the ends of the scan lines may occur. However, the center of scan will be unaffected and, in this event, copy quality can be restored by re-running the aforedescribed set up cycle to recalibrate the control for the new mode hop spectrum.

While the present invention has been described in the context of a raster output scanner, other applications where low cost single mode frequency control of a laser diode is required, as for example in optical communications, optical recording and playback, holographic recording and playback, etc., may be envisioned.

While the invention has been described with reference to the structure disclosed, it is not confined to the details set forth, but is intended to cover such modifications or changes as may come within the scope of the following claims.

What is claimed is:

1. In a printer having a recording member on which images to be printed are formed through exposure, said recording member being movable in a first scanning direction, a laser for generating a beam of high intensity light for exposing said member in accordance with an image signal, a rotatable holographic disc having a succession of beam diffraction gratings, said disc being disposed relative to said laser so that the beam emitted by said laser is in the path of rotation of said disc whereby said beam impinges on said facets in succession as said disc rotates to provide an exposure beam for scanning said recording member in a second scanning direction, the combination of:
   (a) wavelength compensating means for compensating for temperature induced laser mode hop of said beam in said first scanning direction, said compensating means being between said laser and said disc and providing in cooperation with said disc diffraction gratings a non-exposure beam;
   (b) a beam position detector;
   (c) means for focusing said non-exposure beam on said position detector;
   (d) said beam position detector outputting a signal representative of the current point where said non-imaging beam impinges on said beam position detector;
   (e) comparator means for comparing the signal output of said beam position detector with a reference signal representing a preselected point within a non-mode hop region of said laser beam and outputting a control signal when said current point and said preselected point of beam impingement on said beam position detector differ;
   (f) temperature controlling means for controlling temperatures of said laser; and
   (g) control means for operating said temperature controlling means in response to said control signal to adjust the temperature of said laser so that said non-imaging beam impinges at substantially said preselected point on said beam position detector whereby mode hop of said laser beam in said second scanning direction is avoided.

2. The printer according to claim 1 in which said wavelength compensating means comprises a stationary grating.

3. The printer according to claim 1 in which said beam position detector comprises a lateral photodiode.

4. The printer according to claim 1 in which said beam position detector comprises an array of photosites.

5. The printer according to claim 1 in which said focusing means includes a mirror disposed on the side of said disc opposite said compensating means to intercept said non-exposure beam and direct said nonexposure beam toward said beam position detector.

6. The printer according to claim 5 in which said focusing means includes lens means for focusing the non-exposure beam from said mirror onto said beam position detector.

7. The printer according to claim 6 including an imaging lens for focusing said exposure beam on said recording member, said lens means comprising said imaging lens.

8. The printer according to claim 6 including a second mirror downstream of said lens means for directing said non-exposure beam to impinge on said beam position detector.

9. The printer according to claim 1 in which said laser temperature controlling means comprises heating means for heating said laser in response to said control signal.

10. The printer according to claim 1 in which said laser temperature controlling means comprises cooling means for cooling said laser in response to said control signal.

11. The printer according to claim 1 in which said laser temperature controlling means comprises heating and cooling means for selectively heating or cooling said laser in response to said control signal.

12. A method for detecting and eliminating laser mode hoping in a printer having a recording member movable in a first scanning direction, a diode laser, and a rotatable holographic disc with gratings disposed in the path of the beam output of said laser to scan said beam across said recording member in a second scanning direction substantially perpendicular to said first scanning direction, comprising the steps of:

(a) compensating for temperature induced mode hopping of said laser in said first scanning direction by disposing a stationary wavelength compensating grating in the path of the laser beam between the laser and said holographic disc to prevent laser mode hopping in said first scanning direction, said grating cooperating with said holographic disc gratings to produce a zero order beam; and
(b) compensating for temperature induced mode hopping of said laser in said second scanning direction by
  (1) focusing said zero order beam on a beam position detector to provide a first signal representing the point where said zero order beam impinges on said beam position detector;
  (2) comparing said first signal from said beam position detector with a second reference signal representing a desired point of impingement of said beam on said beam position detector within a laser non-mode hop region and providing a corrective signal where said first and second signals are different; and
  (3) adjusting the temperature of said laser in response to said corrective signal so that said zero order beam impinges on said beam position detector at said desired point of impingement to prevent laser mode hopping in said second scanning direction.

* * * * *